(12) United States Patent
Traub

(10) Patent No.: US 6,661,301 B2
(45) Date of Patent: Dec. 9, 2003

(54) OSCILLATOR CIRCUIT

(75) Inventor: Johann Traub, Lauingen (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 10/013,288

(22) Filed: Dec. 10, 2001

(65) Prior Publication Data

US 2002/0070815 A1 Jun. 13, 2002

(30) Foreign Application Priority Data

Dec. 8, 2000 (DE) ............................ 100 61 241

(51) Int. Cl.⁷ .......................... H03B 5/08; H03B 5/12
(52) U.S. Cl. ................. 331/117 R; 331/108 C; 331/117 FE; 331/177 V; 331/179
(58) Field of Search .................. 331/108 C, 116 R, 331/116 FE, 117 R, 117 FE, 117 D, 177 V, 177 R, 179

(56) References Cited

U.S. PATENT DOCUMENTS 5,434,543 A * 7/1995 Brilka et al. ............ 331/117 R
5,739,730 A * 4/1998 Rotzoll ................... 331/177 V
6,323,736 B2 * 11/2001 Jansson ...................... 331/44

* cited by examiner

*Primary Examiner*—David C. Mis
(74) *Attorney, Agent, or Firm*—Laurence A. Greenberg; Werner H. Stemer; Ralph E. Locher

(57) ABSTRACT

An oscillator circuit with connectable capacitance makes it possible for the oscillator to change over between at least two frequencies. A switching unit is provided for the changeover. The switching unit has a first switch which is connected between the switchable capacitances, and also further switches, which are connected with respect to a supply voltage terminal. Compared with conventional oscillators that can be changed over, the novel circuit provides for the advantage that a particularly low forward resistance takes effect in the switched-on state of the connectable capacitances and particularly small parasitic capacitances nevertheless take effect in the switched-off state. The oscillator circuit can be implemented with a particularly small chip area since the switches can be integrated in a common transistor structure with a common control terminal. The oscillator circuit is particularly suitable for mobile radio applications.

11 Claims, 4 Drawing Sheets

OSCILLATOR CIRCUIT

BACKGROUND OF THE INVENTION

FIELD OF THE INVENTION

The present invention relates to an oscillator circuit.

Voltage-controlled oscillators (VCO) are used, for example in transmitting and receiving systems in particular in RF radiofrequency (high frequency) technology. By way of example, voltage-controlled oscillators can be used for constructing phase-locked loops (PLL). In that case, there may be the requirement, on the one hand, that the oscillation frequency of the oscillator be adjusted in an analog manner, that is in an infinitely variably manner. Furthermore, it may also be desired, however, that the oscillation frequency of the oscillator be changed over in discrete steps.

In integrated voltage-controlled oscillators, LC resonant circuits are usually used as the resonator. Those circuits are based on the principle that an LC resonator is deattenuated by means of an amplifier. See, for example, Tietze and Schenk, *Halbleiter-Schaltungstechnik* [Semiconductor circuitry], $10^{th}$ ed. 1993, p. 458 et seq. In that case, the oscillation frequency of the LC oscillator results from the effective inductance and the effective capacitance of the oscillator circuit.

The continuously variable adjustment of the frequency of an LC oscillator is usually effected by way of variable-capacitance diodes which are operated in the reverse direction and whose capacitance value depends on the applied reverse voltage. By contrast, the process of altering the oscillation frequency in fixed discrete steps can be effected by activating or deactivating capacitances with a fixed capacitance value.

If capacitances are connected into an LC resonant circuit, then the resonant circuit frequency is detuned toward lower frequencies. If the switches are open, however, only the parasitic capacitances of the switchable capacitor and of the switch itself act as frequency-detuning elements.

German patent application DE 43 32 798 A1 describes a circuit configuration for a tunable resonant circuit wherein, in the resonator, a respective switch is connected in series with a respective capacitance. The capacitance values are graduated in a binary manner. The resonant frequency of the oscillator can thus be changed over between a plurality of steps.

The published document by Darabi and Abidi, *A 4.5-mW 900-MHz CMOS Receiver For Wireless Paging*, IEEE Journal of Solid-State Circuits, Vol. 35, No. 8, 2000, pages 1085–1095, specifies an adjustable filter whose filter properties can be changed over by binary-graduated capacitances which are connected in parallel being connected or disconnected by means of a respective CMOS switching transistor arranged in series with a respective capacitance.

The published document by Mourant, et al., *A Low Phase Noise Monolithic VCO in SiGe BiCMOS*, IEEE 2000 No. 0-7803-5687-X/00 specifies in FIG. 2 a VCO circuit diagram having both tuneable variable-capacitance diodes D3, D4 and changeover switches, which in each case comprise two transistors using MOS technology.

The published document Kral, et al., *RF-CMOS Oscillators with Switched Tuning*, IEEE 1998, Custom Integrated Circuits Conference, 1998, pages 555–58, shows a voltage-controlled LC oscillator wherein capacitances are provided for the range changeover. A respective radio frequency switch is assigned to and connected in series with the capacitances.

The oscillator circuits specified in the above prior art have in common the disadvantage that they have either a comparatively large parasitic capacitance of the switch in the switched-off state and/or a comparatively large series resistance of the switch in the switched-on state. This is due to the fact that when MOS transistors are used as electronic switches, a large transistor is required in order to obtain a small on-series resistance, but a small transistor is required in order to obtain small parasitic capacitances in the switched-off state.

SUMMARY OF THE INVENTION

It is accordingly an object of the invention to provide an oscillator circuit, which overcomes the above-mentioned disadvantages of the heretofore-known devices and methods of this general type and wherein the oscillation frequency of the oscillator is embodied such that it can be changed over. At the same time, the intention is for parasitic capacitance and on-state resistance of the changeover switches to be low in order to obtain a large capacitance ratio between different switching states and also good phase noise properties.

With the foregoing and other objects in view there is provided, in accordance with the invention, an oscillator circuit, comprising:

a symmetrically constructed oscillator core with a least one inductance and at least one capacitance forming a resonant circuit with a symmetrical oscillation node;

two switchable capacitances connected via a respective terminal to said oscillation node and forming a switching node at free terminals thereof; and a switching unit connected to said switchable capacitances for altering a resonant circuit frequency by activating said switchable capacitances, said switching unit including a first switch for a direct low-impedance connection to one another of said free terminals of said switchable capacitances and further switches for a low-impedance connection of said free terminals of said switchable capacitances to a supply voltage.

In other words, the objects of the invention are achieved with the oscillator circuit that has at least the following features:

a symmetrically constructed oscillator core with at least one inductance and at least one capacitance, which form a resonant circuit with a symmetrical oscillation node;

two switchable capacitances, which are connected by a respective terminal to the oscillation node and form a switching node at their free terminals; and a switching unit for altering a resonant circuit frequency by activating the switchable capacitances. The switching unit includes a first switch for the direct low-impedance connection of the free terminals of the switchable capacitances to one another, and further switches for the low-impedance connection of the free terminals of the switchable capacitances through to a supply voltage terminal.

The terms switch and switching means are used interchangeably and should be understood as synonyms of each other.

The first switching means can directly connect the two switchable capacitances in the switched-on state. Consequently, in the switched-on state of the first switching means, i.e. while the switchable capacitances are effectively connected to the resonator, only the series resistance of this first transistor takes effect. In order to activate the switchable capacitances, a potential connection of the first switch to the supply voltage terminal is required in this case. This is achieved by the further switching means, which, with their controlled paths, connect the two terminals of the controlled path of the first switching means in the switched-on state to the supply voltage terminal in a low-impedance manner.

The switchable capacitances may be embodied as capacitors with a fixed capacitance value.

Compared with an embodiment having two transistors, each of which can connect a respective switchable capacitance to the supply voltage terminal, the described embodiment of activating the switchable capacitances in the case of a symmetrically constructed oscillator has the advantage that, on the one hand, a smaller series resistance of the switching unit takes effect between the switchable capacitances, namely that of the first switching means, and, at the same time, in the event of the switchable capacitances being deactivated, a smaller parasitic capacitance of the switching unit takes effect, so that overall the capacitance ratio between the two switching states is larger and the ratio of the oscillation frequencies of the oscillator circuit between two switching states is thus also larger in frequency terms. Since the two further switching means only effect a potential connection to the supply voltage and can therefore be made very small, the oscillator circuit proposed can, overall, be realized with a very small chip area requirement. In this case, the oscillator circuit described is very well suited to construction using integrated circuitry and can be realized with little complexity in the circuit layout.

Overall, the circuit described has a particularly favorable ratio of the frequency-determining switching resistance of the switching unit to the parasitic capacitances of the switching means of the switching unit, since the on resistance of the further switching means is permitted to be much smaller than the on resistance between the two switchable capacitances.

If the switching means of the switching unit are constructed as MOS transistors, a particularly advantageous intergrability of the oscillator circuit results, since the switching means of the switching unit can be constructed with a particularly simple and area-saving circuit layout.

In a particularly preferred embodiment of the invention, the switching means each have a control input and the control inputs of the switching means are connected to one another to form a switching terminal for changing over the resonant circuit frequency. Using MOS circuitry, for example, it is possible to integrate the switching means as transistors with a common gate.

In a further advantageous embodiment of the present invention, a respective terminal of a respective controlled path of the further switching means is directly connected to a respective terminal of the controlled path of the first switching means. If the switching means are embodied using CMOS circuitry, for example, the integrability of the switching unit can thus be improved further, since the transistors which are directly connected to one another can in each case share source/drain regions.

In a further advantageous embodiment of the present invention, the supply voltage terminal is a reference-ground potential terminal. The reference-ground potential terminal may be, for example, a ground potential of the substrate on which the present oscillator circuit can be integrated. This ground terminal is also referred to as bulk terminal. In a further preferred embodiment of the invention, the switching means are designed as MOS transistors and are integrated in a common transistor structure, a source region of one of the further switching means at the same time being a drain region of the first switching means and a drain region of another further switching means at the same time being a source region of the first switching means.

In a further preferred embodiment of the invention, the drain terminals of the switching means are connected to a bias voltage generating circuit. By way of example, the switching node can be connected via a respective high-value resistor to a positive terminal of a reference voltage source when pMOS transistors are used, or to a negative supply voltage terminal when nMOS transistors are used. As a result of this, the parasitic capacitances formed between drain and substrate terminal or reference-ground potential terminal are reduced, since said capacitances are voltage-dependent and junction-isolated. Moreover, the measure described can also be used to reduce substrate capacitances of integrated trimming capacitances which have a junction isolation with respect to the substrate terminal.

In a further advantageous embodiment of the present invention, the first switching means in the transistor structure comprises a plurality of integrated transistor elements connecting in parallel individual transistor elements, which are also referred to as transistor fingers and may have a common gate terminal, leads to a better noise behavior of the entire oscillator circuit.

In a further preferred embodiment of the invention, the oscillator core is embodied as a tuneable resonant circuit. For this purpose, it is possible to provide, for example, variable-capacitance diodes which may be connected to the capacitances of the oscillator core.

In a further advantageous embodiment of the invention, the oscillator circuit has a deattenuation amplifier, which is designed as a differential amplifier and is coupled to the oscillator core. In this case, the differential amplifier provides a negative impedance which, in order to satisfy a switch-on condition, slightly overcompensates the attenuation of the oscillator core and, in a normal operating state, exactly compensates the attenuation of the oscillator circuit.

In a further advantageous embodiment of the invention, the deattenuation amplifier has two cross-coupled CMOS transistors connected to the oscillation node. In this case, the CMOS transistors may be directly electrically cross-coupled in order to form a negative feedback, or non-direct-electrical couplings may be provided, for example transformer, inductive or capacitive couplings.

In a further advantageous embodiment of the invention, the supply voltage terminal, for providing a bulk potential at the further switching means, is connected to a DC voltage source or a DC current source.

This application of a voltage or DC current to the substrate or bulk terminal reduces the on-state resistance of the switching means. The physical effect that is active in this case is generally referred to as the bulk effect. For this purpose, by way of example, the substrate terminal of the switching transistors or switching means may be connected via a high-value resistor to the switching potential, the gate potential. When the transistors or switching means are switched on, a current then flows via said resistor, which current forward-biases the diode formed between drain and substrate or bulk terminal. In this case, a voltage arises which reduces the on-resistance or on-state resistance of the switching means.

In a further advantageous embodiment of the invention, a means for increasing the signal level is provided, which is connected to a voltage source supplying the oscillator circuit and, at its output, is connected to control inputs of the switching means. The control signal which can be fed to the control inputs of the switching means may be converted into a signal having a higher level by means of a voltage doubler, for example, wherein case the higher level may be higher than a supply voltage of the circuit. This can be achieved for example by means of a voltage doubling circuit and a level shifter which can be connected to the control inputs of the switching means. In this case, a larger gate voltage at the control input of the switching means embodied as CMOS transistors leads to a further reduction in the on-state resistance of the switching means.

Other features which are considered as characteristic for the invention are set forth in the appended claims.

Although the invention is illustrated and described herein as embodied in an oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
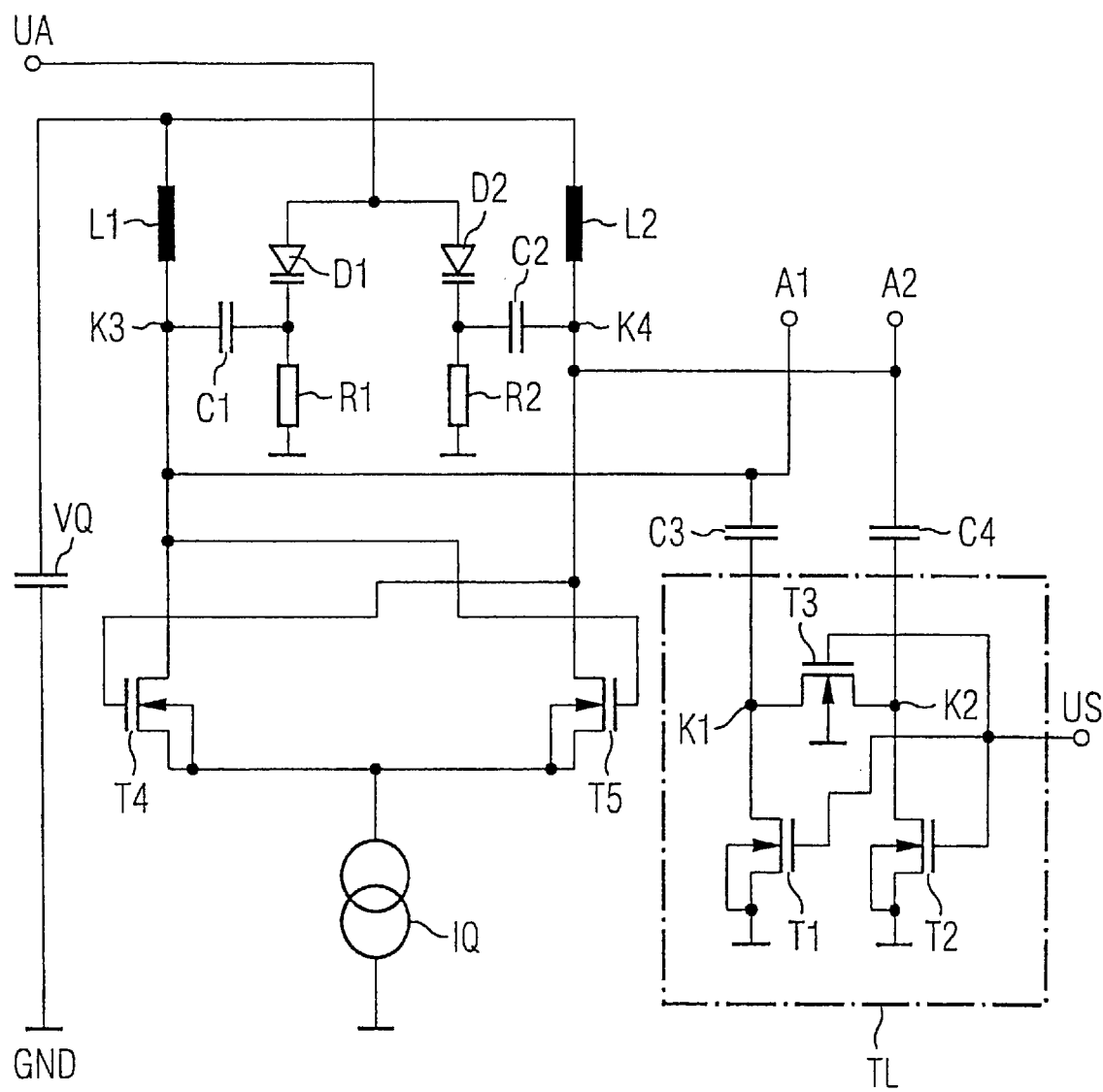
FIG. 1 is a simplified schematic circuit diagram of an exemplary first embodiment of the present invention with a switching unit.

Referring now to the figures of the drawing in detail and first, particularly, to FIG. 1 thereof, there is shown an oscillator core in a symmetrical embodiment with two capacitances C1, C2, to which, at a first terminal, a respective cathode terminal of a varactor diode D1, D2 embodied as a variable-capacitance diode is connected. A tuning terminal UA is connected to the anode terminals—connected to one another—of the varactor diodes D1, D2, which serve as tuning diodes of the resonant circuit, to which tuning terminal a control voltage of the voltage-controlled oscillator can be fed. The free terminals of the capacitances C1, C2 are connected to a respective resonator inductance L1, L2 at a symmetrical oscillation node K3, K4. The free terminals of the inductances L1, L2 are connected to one another and are connected to the positive voltage terminal of a voltage source VQ which supplies the oscillator circuit.

A deattenuation amplifier embodied as a differential amplifier comprises two cross-coupled MOS transistors T4, T5, which are connected by their drain terminals to the oscillation node K3, K4 and are connected by their source terminals to one another and to a current source IQ.

Connectable capacitances C3, C4 are connected to the oscillation node K3, K4 by a respective one of their terminals, and form a switching node K1, K2 with their free terminals. A switching unit TL is connected to said switching node K1, K2, which switching unit can effectively switch the connectable capacitances C3, C4 into the resonator as required.

In detail, the switching unit TL comprises a first switching means T3, which is embodied as a MOS transistor, whose substrate terminal is connected to a reference-ground potential terminal GND and whose drain and source terminals are connected to the symmetrical switching node K1, K2. Furthermore, further switching means T1, T2, which are likewise embodied as MOS transistors, are connected to the switching node K1, K2 in each case by their drain terminal. The source terminals of the first and second transistors T1, T2 are directly connected to the reference-ground potential terminal GND. The control inputs, or gate terminals, of the transistors T1, T2, T3 are connected to one another at a switching terminal US, to which can be fed a switching voltage for connecting or disconnecting the connectable capacitances C3, C4.

Compared with customary switching arrangements of the switching unit TL wherein the transistor T3 is not present, the present circuit has the advantage that the current flow from capacitance C3 to capacitance C4 and vice versa does not flow via controlled paths of two transistors and via reference-ground potential, but rather only via the controlled path of one transistor in this case the transistor T3. Accordingly, only one transistor T3 is active with regard to switching resistance in the switched-on state, so that the on resistance between the switchable capacitances is significantly reduced. In the switched-off state, too, the parasitic-capacitive properties of the switching unit are improved, since the further switching means, the transistors T1, T2, have a small parasitic capacitance with respect to the reference-ground potential terminal GND. This is because, since the current between capacitances C3 and C4 can flow via transistor T3, the transistors T1, T2 are permitted to be made very small, as a result of which they have small parasitic capacitances.

Accordingly, the oscillator circuit described has a particularly large ratio of effective resonant circuit capacitance with connected switchable capacitances relative to the resonant circuit capacitance without connected switchable capacitances, even taking account of the respectively effective parasitic capacitances. As a result of this, the ratio of the oscillation frequencies between which changeover can be effected is very large. Moreover, since the series resistance of the switching unit TL is very small, overall the oscillator circuit has excellent noise properties.

It goes without saying that, instead of the switchable capacitances C3, C4 that are illustrated, it is possible to provide further, for example binary-graduated, capacitances switchable by means of switching unit TL, so that it is possible to change over between more than two oscillator frequencies.

The output frequency of the circuit can be tapped off at the symmetrical output A1, A2, which is connected to the switching node K3, K4.

Figure 2:
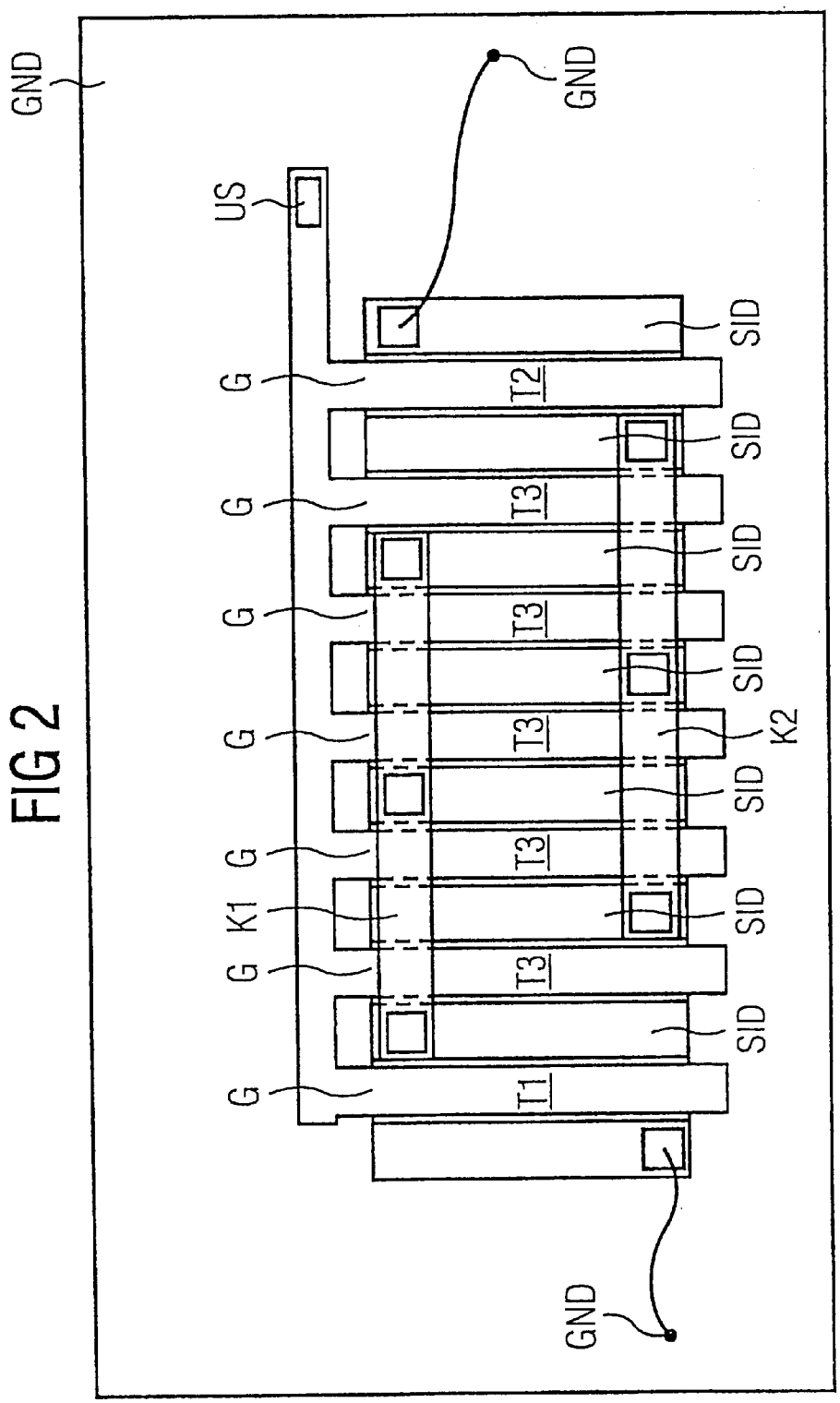
FIG. 2 is a diagram showing an exemplary layout of the switching means of the switching unit of FIG. 1 in CMOS technology.

FIG. 2 shows a possible layout of the switching unit TL in MOS technology, in a simplified plan view. In this case, the reference-ground potential terminal GND embodied as bulk or substrate is shown in an outer rectangular frame. This terminal is connected to a respective source/drain terminal S/D of transistor T1 and transistor T2, in each case arranged on the outside. A respective further source/drain terminal of transistors T1 and T2 forms a respective source/ drain terminal of a respective transistor element of the first switching means T3. In total, the transistor T3 comprises five individual transistors which are connected up differentially. For this purpose, the contact elements of the switching nodes K1, K2 are provided, which in each case connect comb-like intermeshing source/drain regions S/D alternately to one another. Accordingly, the source/drain regions S/D are alternately connected to the switching node K1 and switching node K2. A channel of the MOS individual transistors is in each case arranged between the source/drain regions S/D. A respective gate terminal is provided above said channel, all the gate terminals G of the first, second and all the third transistors T1, T2, T3 being directly electrically connected to one another. The gate terminal, or switching terminal US, connecting the gate regions G may be embodied at one end, as shown, or at both ends.

Overall, the layout of the switching unit can be realized in a particularly space-saving manner and with little complexity. Since the transistors T1 to T3 can utilize a common transistor structure, in particular since they have a common gate terminal G, the area requirement and the layout complexity are particularly low. It is evident that transistor T3, which comprises five individual transistor elements in the exemplary embodiment shown, has a comparatively large channel width as a result of a plurality of individual transistors being connected in parallel, while the transistors T1 and T2 are realized in particularly small structures. The result of this is that, in the switched-off state, the transistors T1 and T2 have particularly low parasitic capacitances with respect to reference-ground potential GND and, with the transistors switched on, the forward resistance or series resistance of the third transistor T3 is particularly low. It is thus ensured that the otherwise conflicting requirements for low on-resistance and thus a small phase noise of the oscillator in conjunction, nevertheless, with small parasitic capacitances with respect to reference-ground potential GND can be reconciled.

In alternative embodiments, the transistor T3 could comprise as many individual transistors as desired. By connecting in parallel the as many individual transistors as desired, it is possible to obtain a channel width that is as large as desired.

Figure 3:
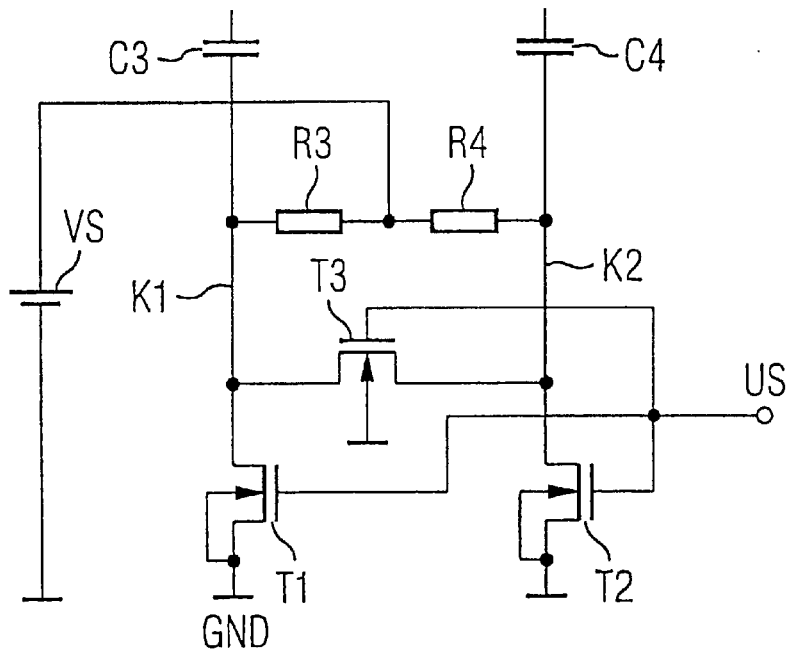
FIG. 3 is a circuit schematic showing a development of the switching unit of FIG. 1 with reduced parasitic transistor capacitance.

FIG. 3 shows a switching unit which, compared with the switching unit TL of FIG. 1, has a parasitic capacitance that is reduced further with the transistors switched off. In this case, a respective high-value resistor R3, R4 is connected between the symmetrical switching node K1, K2 and the positive terminal of a supply voltage source VS. This has the effect that the parasitic capacitance of the transistors T1, T2 which is formed between the drain terminals and ground or reference-ground potential terminal GND is significantly reduced on account of the DC voltage present. Instead of the resistors R3, R4, small MOS transistors could also be provided. If the transistors T1, T2 are not embodied using pMOS technology, as shown, but rather using nMOS technology, then it is necessary to reverse the polarity of the voltage source VS.

If additional trimming capacitances are integrated in the case of the oscillator circuit in accordance with FIG. 1 with a switching unit in accordance with FIG. 3, then the measure described in accordance with FIG. 3 also reduces the substrate capacitances of the integrated trimming capacitances with junction isolation with respect to substrate, as a result of which the parasitic capacitances of the entire arrangement are reduced further.

Figure 4:
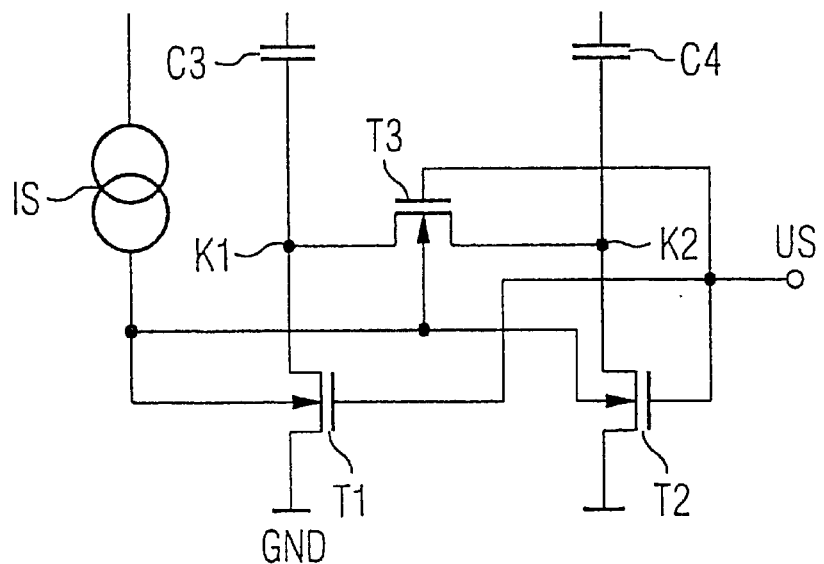
FIG. 4 is a circuit schematic showing a development of the switching unit of FIG. 1 utilizing the bulk effect.

FIG. 4 shows a development of the switching unit TL of FIG. 1 to the effect that the on-state resistance of the switching transistors is reduced further. For this purpose, a current source IS is provided, which makes it possible to utilize the so-called bulk effect. This is because the on resistances of the transistors T1, T2, T3 are reduced by the biasing of the bulk potential or substrate potential or reference-ground potential.

Figure 5:
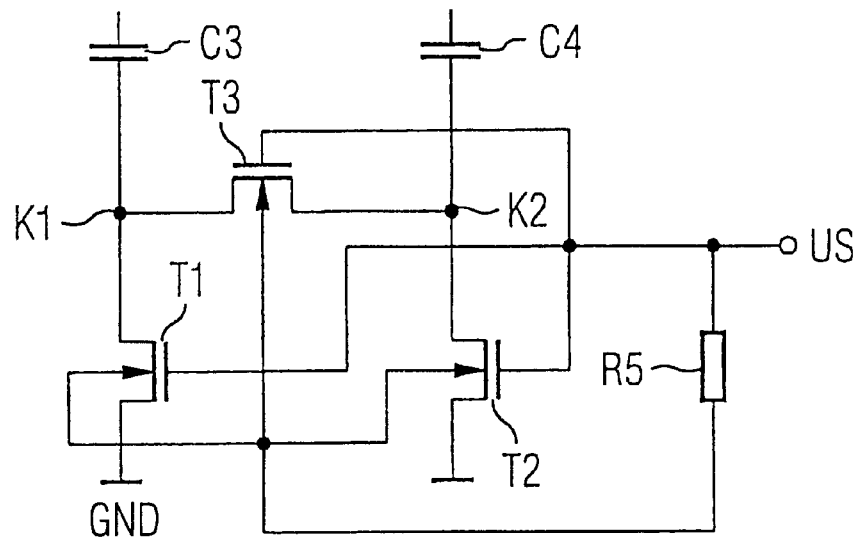
FIG. 5 is a circuit schematic showing a further possibility for the realization of the switching unit of FIG. 1 utilizing the bulk effect in a simplified form.

FIG. 5 shows a simplified embodiment of the circuit for utilizing the bulk effect in accordance with FIG. 4. Instead of the current source IS, however, in this case a high-value resistor R5 is provided, which, at one end, is connected to the substrate terminals of the transistors T1, T2, T3 and, at the other end, is connected to the control terminal of the common gate terminals of the transistors T1 to T3. When the transistors T1 to T3 are switched on, a current flows via the resistor R5, which current forward-biases a diode formed between drain and substrate terminals of the transistors. The bulk effect causes the voltage produced in this case to lead to a reduction of the on-state resistance of the transistors.

Figure 6:
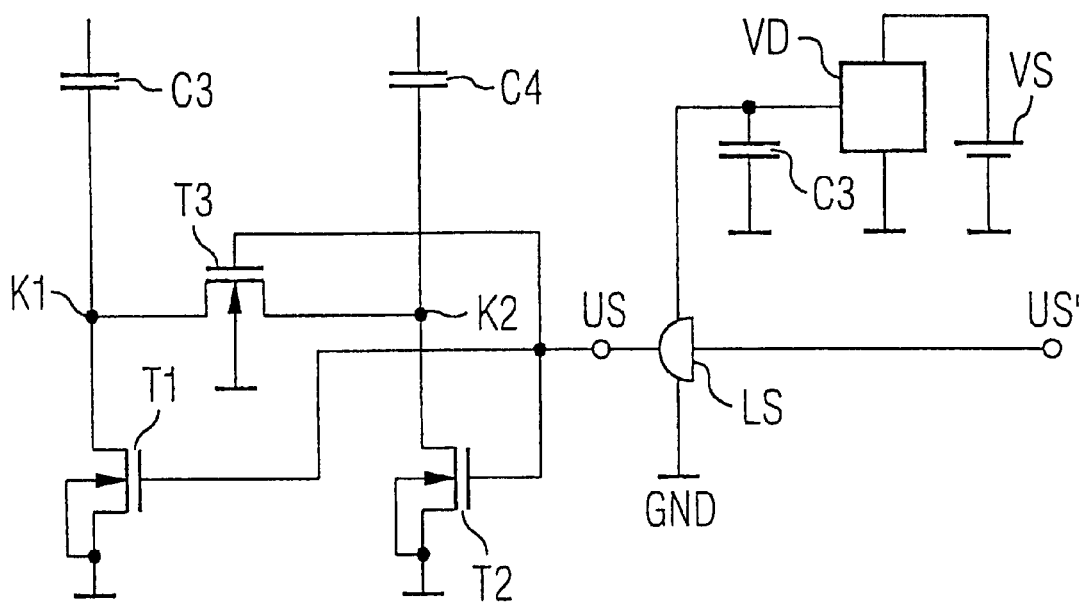
FIG. 6 is a circuit schematic of a development of the switching unit of FIG. 1 with an increased control level of the switching means.

FIG. 6 shows a development of the switching unit TL from FIG. 1 to the effect that a voltage doubling circuit VD is coupled to the gate terminals of the transistors T1 to T3. As a result of the increase in the gate potential of the transistors T1 to T3 beyond a supply voltage potential, the on-state resistance of the transistors T1 to T3 is reduced further. In detail, a voltage doubling circuit VD is provided, which is connected to a voltage source VS on the input side. On the output side of the voltage doubling circuit VD, a smoothing capacitance C3 with respect to the reference-ground potential terminal GND is provided. Furthermore, a level shifter LS is connected to the output of the voltage doubling circuit VD, which level shifter increases the potential at a switching terminal US', which is connected on the input side, at a switching terminal US on the output side. This switching terminal US is connected to the control inputs of the transistors T1 to T3.

The described exemplary embodiments of an oscillator circuit are particularly suitable for application in voltage-controlled oscillators, as they are used, for example, in mobile radio communications devices.

I claim:
1. An oscillator circuit, comprising:
   a symmetrically constructed oscillator core with a least one inductance and at least one capacitance forming a resonant circuit with a symmetrical oscillation node;
   two switchable capacitances connected via a respective terminal to said oscillation node and forming a switching node at free terminals thereof; and
   a switching unit connected to said switchable capacitances for altering a resonant circuit frequency by activating said switchable capacitances, said switching unit including a first switch for a direct low-impedance connection to one another of said free terminals of said switchable capacitances and further switches for a low-impedance connection of said free terminals of said switchable capacitances to a supply voltage, said first switch and said further switches being MOS transistors and being integrated in a common transistor structure of said switching unit, a source region of one of said further switches also forming a drain region of said first switch, and a drain region of another of said further switches also forming a source region of said first switch.

2. The oscillator circuit according to claim 1, wherein said first switch and said further switches have respective control inputs connected to one another to form a switching terminal for changing over a resonant circuit frequency.

3. The oscillator circuit according to claim 1, wherein said first switch and said further switches each has a controlled path, and wherein a respective terminal of a respective controlled path of said further switches is directly connected to a respective terminal of said controlled path of said first switch.

4. The oscillator circuit according to claim 1, wherein the supply voltage is a reference-ground potential terminal.

5. The oscillator circuit according to claim 1, which further comprises a bias voltage generating circuit, and wherein said further switches have drain terminals connected to a bias voltage generating circuit.

6. The oscillator circuit according to claim 1, wherein said first switch in said common transistor structure comprises a plurality of integrated transistor elements connected in parallel.

7. The oscillator circuit according to claim 1, wherein said oscillator core is a tuneable resonant circuit.

8. The oscillator circuit according to claim 1, which comprises a deattenuation amplifier, formed as a differential amplifier and coupled to said oscillator core.

9. The oscillator circuit according to claim 8, wherein said deattenutation amplifier comprises two cross-coupled MOS transistors connected to said switching node.

10. An oscillator circuit, comprising:
- a symmetrically constructed oscillator core with a least one inductance and at least one capacitance forming a resonant circuit with a symmetrical oscillation node;
- two switchable capacitances connected via a respective terminal to said oscillation node and forming a switching node at free terminals thereof;
- a switching unit connected to said switchable capacitances for altering a resonant circuit frequency by activating said switchable capacitances, said switching unit including a first switch for a direct low-impedance connection to one another of said free terminals of said switchable capacitances and further switches for a low-impedance connection of said free terminals of said switchable capacitances to a supply voltage; and
- a DC source selected from the group consisting of a DC voltage source and a DC current source, and a supply voltage terminal carrying said supply voltage being connected to said DC source for providing a bulk potential at said further switches.

11. An oscillator circuit, comprising:
- a symmetrically constructed oscillator core with a least one inductance and at least one capacitance forming a resonant circuit with a symmetrical oscillation node;
- two switchable capacitances connected via a respective terminal to said oscillation node and forming a switching node at free terminals thereof;
- a switching unit connected to said switchable capacitances for altering a resonant circuit frequency by activating said switchable capacitances, said switching unit including a first switch for a direct low-impedance connection to one another of said free terminals of said switchable capacitances and further switches for a low-impedance connection of said free terminals of said switchable capacitances to a supply voltage and
- a device for increasing a signal level connected to a voltage source and having an output connected to control inputs of said first and further switches.

* * * * *

UNITED STATES PATENT AND TRADEMARK OFFICE
CERTIFICATE OF CORRECTION

PATENT NO. : 6,661,301 B2  Page 1 of 1
DATED : December 9, 2003
INVENTOR(S) : Johann Traub It is certified that error appears in the above-identified patent and that said Letters Patent is hereby corrected as shown below:

Title page,
Item [56], References Cited, should read as follows:
--                U.S. PATENT DOCUMENTS
4,827,226 A        5/1989      Connell
5,434,543 A   *    7/1995      Brilka et al.       331/117 R
5,739,730 A   *    4/1998      Rotzoll             331/177 V
6,091,304 A        7/2000      Harrer
6,127,900 A        10/2000     Laub et al.
6,147,567 A        11/2000     Welland et al.
6,239,665 B1       5/2001      Strom
6,323,736 B2  *    11/2001     Janson              331/44
2001/0048608 A1    12/2001     Numata et al.
            FOREIGN PATENT DOCUMENTS
DE   43 32 798 A1    *    3/1995
            OTHER PUBLICATIONS
Kral et al.: "RF-CMOS Integrated Oscillators with Switched Tuning", IEEE 1998, Custom Intergrated Circuits Conference, 1998, pages 555-558.

Tietze: "Halbleiter-Schaltungestechnik" [Semiconductor Circuit Engineering], $10^{th}$ Edition, 1993, pages 458-487.

J.-M. Mourant et al.: "A low-phase noise monolithic VCO in SiGe BiCMOS". IEEE, 2000, 0-7803-5687-x/00.

Darabi et al.: "A 4.5-m-W 900-MHz CMOS Receiver for Wireless Paging", IEEE Journal of Solid-State Circuits, Vol. 35, No. 8, Aug. 2000, pages 1085-1096. --

Signed and Sealed this

Twenty-third Day of March, 2004

JON W. DUDAS
*Acting Director of the United States Patent and Trademark Office*